(12) United States Patent
Ito et al.

(10) Patent No.: US 8,335,242 B2
(45) Date of Patent: Dec. 18, 2012

(54) NITRIDE SEMICONDUCTOR LASER DEVICE MOUNTED ON A STEM

(75) Inventors: Shigetoshi Ito, Shijonawate (JP); Daisuke Hanaoka, Kyoto (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 1186 days.

(21) Appl. No.: 11/038,123

(22) Filed: Jan. 21, 2005

(65) Prior Publication Data

US 2005/0157769 A1 Jul. 21, 2005

(30) Foreign Application Priority Data

Jan. 21, 2004 (JP) ................................. 2004-013327

(51) Int. Cl.
*H01S 3/04* (2006.01)
*H01S 5/00* (2006.01)
(52) U.S. Cl. ...................................... 372/36; 372/43.01
(58) Field of Classification Search .................... 372/36, 372/43.01
See application file for complete search history.

(56) References Cited

U.S. PATENT DOCUMENTS

| 4,207,149 | A | * | 6/1980 | Mason et al. | .................. | 205/266 |
| 5,504,349 | A | | 4/1996 | Yoshino | | |
| 5,557,116 | A | * | 9/1996 | Masui et al. | .................. | 257/100 |
| 2003/0043868 | A1 | * | 3/2003 | Stewart et al. | .................. | 372/36 |
| 2003/0086243 | A1 | * | 5/2003 | Harding | ........................ | 361/700 |
| 2005/0157769 | A1 | * | 7/2005 | Ito et al. | .......................... | 372/43 |

FOREIGN PATENT DOCUMENTS

| JP | 61-88259 | 6/1986 |
| JP | 63-25988 | 2/1988 |
| JP | 63-62257 | 3/1988 |
| JP | 4-96388 | 3/1992 |
| JP | 7-58413 | 3/1995 |
| JP | 10-313147 | 11/1998 |
| JP | 11-186662 | 7/1999 |
| JP | 2003-051637 | 2/2003 |

* cited by examiner

*Primary Examiner* — Jessica Stultz
*Assistant Examiner* — Marcia Golub-Miller
(74) *Attorney, Agent, or Firm* — Morrison & Foerster LLP

(57) ABSTRACT

Provided is a semiconductor laser device that is free from or suffers less from deterioration resulting from a surge or that is less likely to suffer from deterioration resulting from a surge. The semiconductor laser device has a conductive stem 101, a submount 102 fixed to the stem 101, a nitride semiconductor laser chip 103 mounted on the submount 102, pins 104 and 105 fixed to the stem 101 but insulated therefrom, a wire connecting the pin 104 to a p-electrode of the nitride semiconductor laser chip 103, a wire connecting the pin 105 to an n-electrode of the nitride semiconductor laser chip 103, and a cap 106 enclosing the nitride semiconductor laser chip 103 and the submount 102 and fixed to the stem 101.

3 Claims, 7 Drawing Sheets

PRIOR ART

NITRIDE SEMICONDUCTOR LASER DEVICE MOUNTED ON A STEM

This nonprovisional application claims priority under 35 U.S.C. §119(a) on Patent Application No. 2004-013327 filed in Japan on Jan. 21, 2004, the entire contents of which are hereby incorporated by reference.

BACKGROUND OF THE INVENTION

1. Field of the Invention

The present invention relates to a nitride semiconductor laser device incorporating a nitride semiconductor laser chip using a nitride-based compound.

2. Description of Related Art

Nitride semiconductors are materials that can emit light in a short-wavelength band including the ultraviolet to green region. In recent years, blue-violet semiconductor lasers have been developed particularly eagerly using such materials. For example, Patent Publication 1 discloses an example of a nitride semiconductor laser device.

FIG. 7A is a perspective view of a semiconductor laser device, with the cap thereof removed to show the structure inside, and FIG. 7B is a perspective view of the exterior appearance of the semiconductor laser. A semiconductor laser chip 1003 is mounted on a metal stem 1001 so that heat is efficiently dissipated to the stem 1001. An electrode (for example, a p-electrode) on the top face of the semiconductor laser chip 1003 is electrically connected, via a wire, to a pin (bar-shaped electrical terminal) 1004 fixed to the stem 1001. On the other hand, an electrode (for example, an n-electrode) on the bottom face of the semiconductor laser chip 1003 is electrically connected to the stem 1001 itself. The stem 1001 itself is electrically connected to another pin 1005. The pin 1004 is fixed to the stem 1001, but is insulated from the stem 1001 itself.

In this structure, when an electric current is fed between the pins 1004 and 1005, the current is fed to the semiconductor laser chip 1003, which thus carries out laser oscillation. As shown in FIG. 7B, the semiconductor laser chip 1003 and the wire are protected by being enclosed in a metal cap 1006. The cap 1006 has formed therein a window 107 through which to extract laser light.

It has been found that a semiconductor laser device using a nitride semiconductor laser chip 1003, like the one described above, is vulnerable, in particular, to a surge. A nitride semiconductor laser chip 1003 readily deteriorates when exposed to a surge as may be applied to the chip via a supply voltage line during the process for evaluating the characteristics of a semiconductor laser device, or when exposed to static electricity (which, for the sake of convenience, is also dealt with as a kind of surge in the present specification) that may be applied to the chip accidentally in the fabrication line for fabricating an end product incorporating a semiconductor laser device as a light source.

SUMMARY OF THE INVENTION

An object of the present invention is to provide a semiconductor laser device that is free from or suffers less from deterioration resulting from a surge or that is less likely to suffer from deterioration resulting from a surge.

According to the present invention, a nitride semiconductor laser device is provided with a cap formed out of a nonconductive material for enclosing wires and a nitride semiconductor laser chip.

In this structure, the absence of electrical shielding of the laser chip and wires as achieved with a conductive cap is surmised to permit a surge current pulse, a phenomenon that takes place very fast, to discharge elsewhere than through the laser chip (in particular, the light-emitting region thereof). This effectively reduces the surge-induced deterioration of the nitride semiconductor laser chip, or makes the nitride semiconductor laser chip resistant to higher surges.

According to the present invention, a cap formed out of a nonconductive material is provided to enclose wires and a nitride semiconductor laser chip. This makes it possible to realize a semiconductor laser device that is free from or suffers less from deterioration resulting from a surge or that is less likely to suffer from deterioration resulting from a surge.

DETAILED DESCRIPTION OF PREFERRED EMBODIMENTS

Hereinafter, nitride semiconductor laser devices embodying the present invention will be described by way of three practical examples thereof.

First Embodiment

Figure 1A:
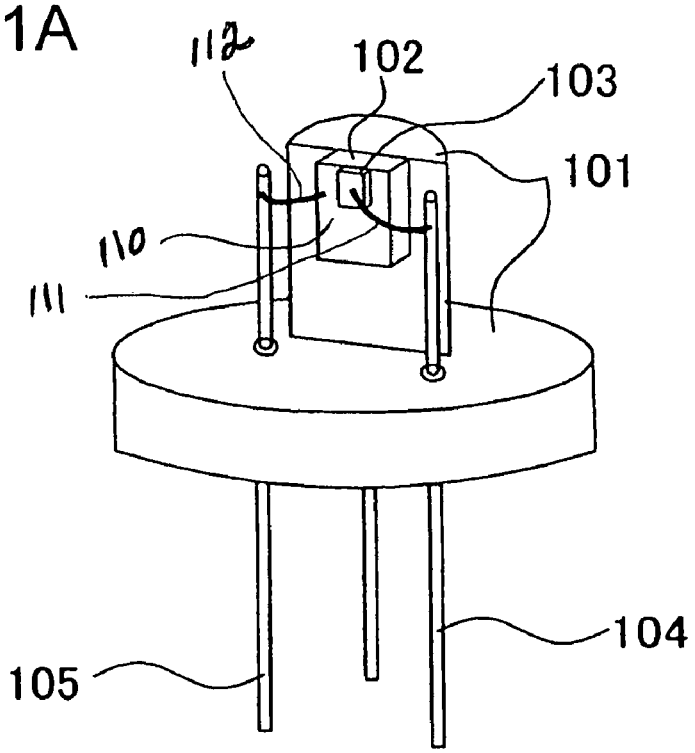
FIG. 1A is a perspective view of a semiconductor laser device of a first embodiment of the invention, with the cap thereof removed to show the structure inside.
Figure 1B:
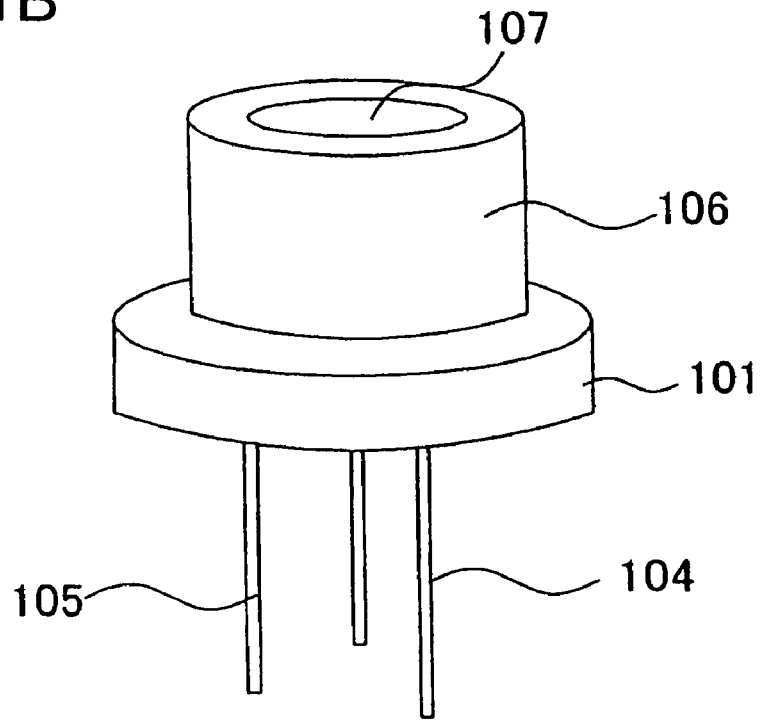
FIG. 1B is a perspective view showing the exterior appearance of the laser device of the first embodiment.

FIG. 1A is a perspective view of a semiconductor laser device of a first embodiment of the invention, with the cap thereof removed to show the structure inside, and FIG. 1B is a perspective view showing the exterior appearance of the laser device of the first embodiment. A nitride semiconductor laser chip 103 is mounted on a metal stem (mount) 101, with an insulating submount 102 placed in between.

The stem 101 has, on the top face of a disk-shaped plate that serves as a base thereof, a semicircular-column-shaped projecting portion on which to mount a submount. Largely the entire stem 101 is gold-plated. The submount 102 is mounted in a flat-surface portion on a side face of the projecting portion, and is rectangular-block-shaped. The nitride semiconductor laser chip 103 is so mounted that the light outputted therefrom is emitted in the direction perpendicular to the disk-shaped plate of the stem 101. An electrode (p-electrode)

on the top face of the nitride semiconductor laser chip 103 is electrically connected, via a wire 111, to a pin (electrical terminal) 104 fixed to the stem 101. On the other hand, an electrode (n-electrode) on the bottom face of the nitride semiconductor laser chip 103 is connected to an conductive member 110 on the surface of the submount 102. This electrode on the surface of the submount 102 is connected, via a single wire 112, to another pin 105.

The nitride semiconductor laser chip 103 and the above-mentioned wires 111, 112 are protected by being enclosed in a nonconductive cap 106. The cap 106 has formed therein a window 107 through which to extract laser light. The stem 101 is formed out of a material that predominantly contains iron or copper. In particular, forming the disk-shaped plate out of a metal that predominantly contains iron permits easy processing, and is advantageous in terms of cost. Forming the projecting portion out of a metal that predominantly contains iron is advantageous in terms of cost; however, forming this portion out of a metal that predominantly contains copper is more advantageous than using iron in terms of heat dissipation from the nitride semiconductor laser chip 103.

For effective dissipation of heat from the nitride semiconductor laser chip 103 to the stem 101, it is preferable that the submount 102 be formed out of a material having high thermal conductivity, examples of such materials including aluminum nitride and silicon carbide. The submount 102 may be formed out of diamond or boron nitride. The submount 102 may even be formed out of insulating silicon or aluminum oxide, but, from the viewpoint of thermal conductivity, the previously mentioned materials are preferable.

Suitable materials for the cap 106 include: engineering plastics such as polyphenylene sulfide resin, liquid crystal polyester resin, ABS resin, nylon resin, polycarbonate resin, polyacetal resin, and polyimide; and ceramics such as alumina and zirconia.

It is preferable that the window 107 be covered with glass coated with a nonreflective coating so that the nitride semiconductor laser chip 103 is shielded from outside air. For use in an environment in which condensation is unlikely, however, the window 107 may be left simply as a hole, with no glass covering it.

Figure 2:
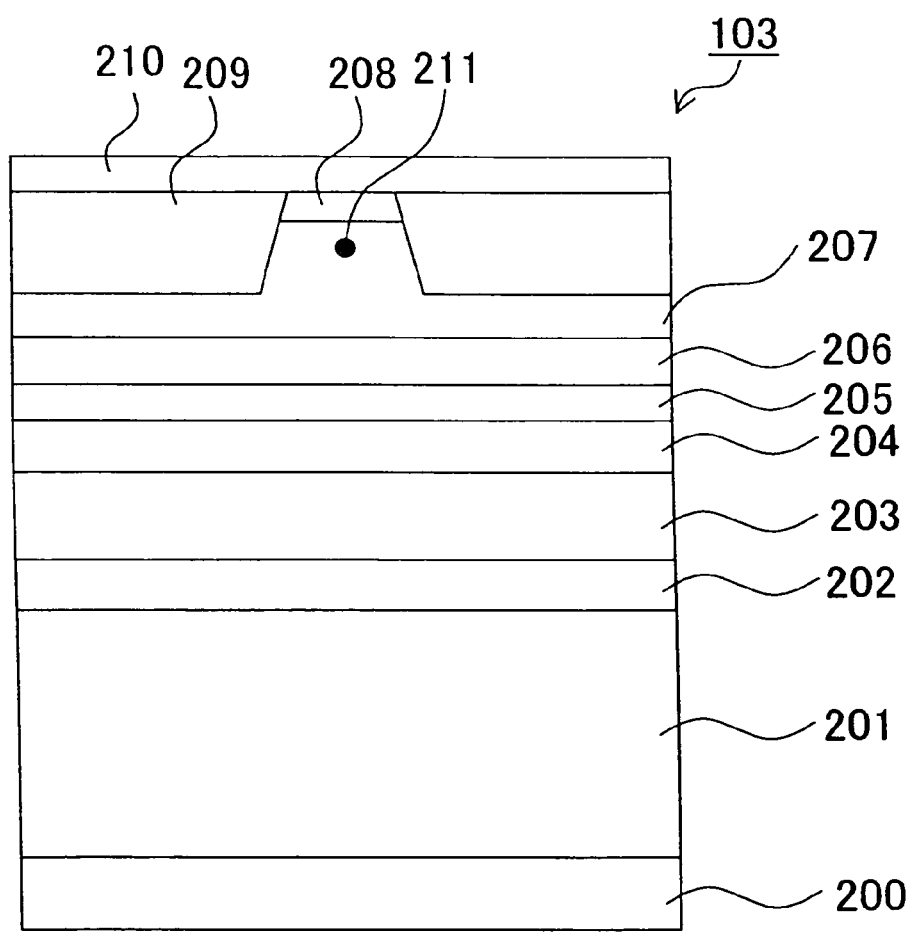
FIG. 2 is a side view of the nitride semiconductor laser chip used in the first embodiment.

FIG. 2 is a side view of the nitride semiconductor laser chip 103 used in the first embodiment. What FIG. 2 shows is the state of the nitride semiconductor laser chip 103 before it is mounted on the submount 102. The nitride semiconductor laser chip 103 has, on top of an n-type GaN substrate 201, the following layers laid on one another in the order in which they are named: an n-AlGaInN buffer layer 202, an n-AlGaInN clad layer 203, an n-AlGaInN guide layer 204, an AlGaInN multiple quantum well active layer 205, a p-AlGaInN guide layer 206, a p-AlGaInN clad layer 207, and a p-AlGaInN contact layer 208.

The active layer 205 may contain about 0.01% to 10% of a group V material such as As or P. In at least part of the p-AlGaInN guide layer 206, p-AlGaInN clad layer 207, and p-AlGaInN contact layer 208, a stripe-shaped ridge 211 is formed that extends in the direction of the cavity. The width of the stripe is about 1.2 µm to 2.4 µm, and typically about 1.8 µm.

A p-electrode 210 is formed in contact with the p-AlGaInN contact layer 208, and an insulating film 209 is formed beneath the p-electrode 210 except where the ridge 211 is formed. Thus, the nitride semiconductor laser chip 103 has a so-called ridge stripe structure. Furthermore, an n-electrode 200 is formed on the bottom face of the nitride semiconductor laser chip 103. The nitride semiconductor laser chip 103 is bonded, on the n-electrode side thereof, to the submount 102.

Next, with reference to FIGS. 1A, 1B, and 2, the procedure for fabricating the semiconductor laser device of this embodiment will be described. First, by an appropriate process for fabricating a nitride semiconductor laser device, a semiconductor laser wafer is produced that has formed on the n-type GaN substrate 201 a large number of unit structures of the nitride semiconductor laser chip 103. This process for producing the wafer is well known, and therefore no detailed description thereof will be given.

Next, the n-type GaN substrate 201 is polished or etched from the bottom face thereof to remove part of the substrate so that the thickness of the wafer is adjusted to be typically as small as about 40 µm to 150 µm. Then, the n-electrode 200 is formed on the back face of the wafer. Thereafter, by a bar separation process, the wafer is separated into laser bars each having laser chips arranged continuously side by side. Then, the end surfaces are coated with a coating that permits the reflectivity thereof to be adjusted appropriately. Thereafter, by a chip separation process, each laser bar is separated into individual semiconductor laser chips. In this way, the nitride semiconductor laser chip 103 shown in FIG. 2 is produced.

The dimensions of the nitride semiconductor laser chip 103 are: in the direction of the length of the cavity, 200 µm to 1,500 µm, typically about 600 µm; in the direction perpendicular to the direction of the length of the cavity, 200 µm to 1,000 µm, typically about 300 µm; and, in the direction of the thickness, 50 µm to 300 µm, typically about 100 µm.

Next, by die bonding, the nitride semiconductor laser chip 103 is mounted on the submount 102. Then, the submount 102 having the nitride semiconductor laser chip 103 mounted thereon is mounted, by die bonding, on the stem 101. The dimensions of the stem 101 are: in the disk-shaped portion 2 mm to 9 mm in diameter, typically about 5.6 mm in diameter; and, in the column-shaped projecting portion, 1 mm to 3 mm in height, typically about 1.5 mm in height.

Thereafter, the p-electrode 210 is electrically connected, via a wire 111, to the pin 104. Since the n-electrode 200 is bonded to the submount 102, connecting the conductive member 110 on the surface of the submount 102 via a wire 112 to the pin 105 makes it possible to energize the n-electrode from outside. This permits the nitride semiconductor laser chip provided in the semiconductor laser device of this embodiment to be fed with a current from outside.

The pins 104 and 105 are each electrically insulated from the stem 101. Moreover, the n-electrode 200 and the stem 101 are insulated from each other by the insulating submount 102. This permits voltages to be applied to the p- and n-electrodes 210 and 200 arbitrarily relative to the stem 101.

This eliminates the need for a high voltage in the driving of the nitride semiconductor laser chip 103, which requires a drive voltage typically as high as 4 V or more, which is higher than those required by other materials (such as those AlGaAs-based and InGaAlP-based materials). Advantageously, this makes it possible, for example, to distribute the drive voltage into a positive and a negative voltage as by driving the positive electrode with about +2 V and the negative electrode with about −2 V. This offers benefits, as by eliminating the need for a high-voltage IC circuit, in the application of the device. As the result, however, if a surge current enters the semiconductor laser device, it may pass exclusively through the nitride semiconductor laser chip 103, causing the characteristics thereof to deteriorate more easily.

Furthermore, to protect the nitride semiconductor laser chip 103 and the wires 111, 112, the cylindrical resin cap 106 for enclosing them is fixed, with adhesive, to the disk-shaped portion of the stem. The dimensions of the cap 106 are: in diameter, about 0.5 mm to 3 mm smaller than the disk-shaped portion; and, in height, about 0.3 mm to 3 mm larger than the projecting portion. The height of the column-shaped projecting portion is 1 mm to 3 mm, and typically about 1.5 mm. In this way, the semiconductor laser device shown in FIG. 1B is produced. Although omitted in this embodiment, a detector may be provided on the stem 101 for monitoring the laser power by receiving the light emitted from the back face of the nitride semiconductor laser chip 103.

When the semiconductor laser device of this embodiments was used as a light source in an optical recording system, it, as compared with semiconductor laser devices having a metal cap (formed out of, for example, a metal that predominantly contains iron), suffered dramatically less from failure resulting from the deterioration of the semiconductor laser device attributable to surges in the fabrication line of the optical recording system. To qualitatively evaluate this, the electrostatic withstand voltage of the semiconductor laser device was tested.

Figure 3:
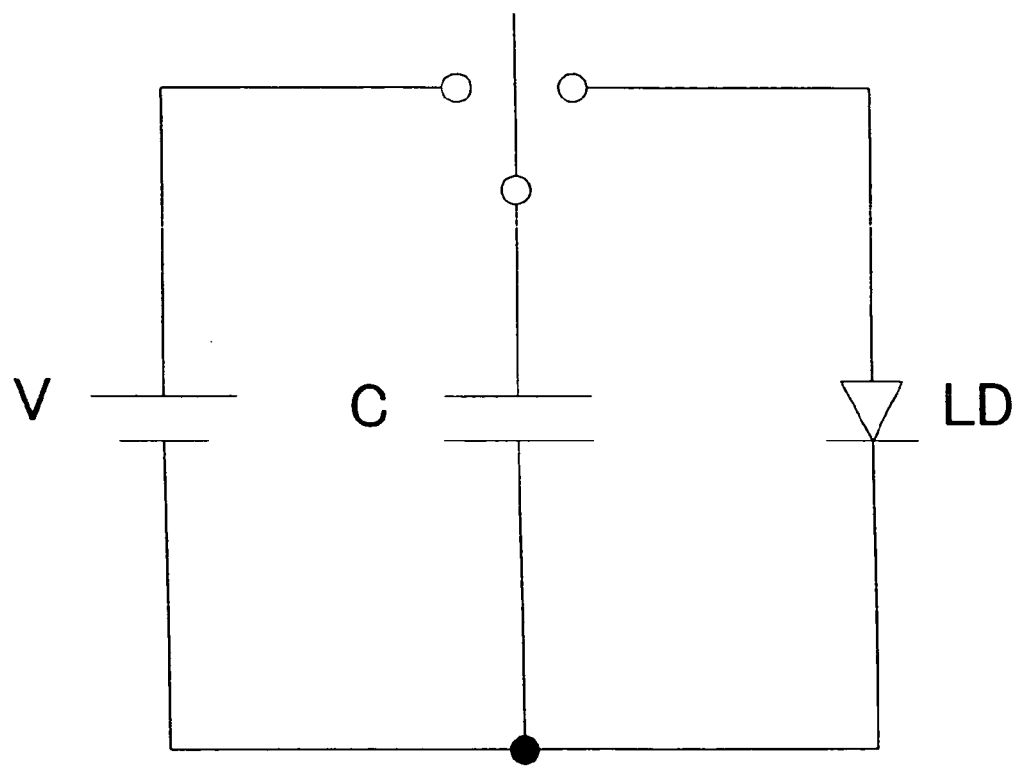
FIG. 3 is a diagram showing an equivalent circuit of the testing apparatus.

FIG. 3 is a diagram showing an equivalent circuit of the testing apparatus. When a switch is operated, the electric charge accumulated in a capacitor by a direct-current source V is discharged through the semiconductor laser chip via the connection terminals of the semiconductor laser device in such a way as to simulate a surge phenomenon. The supplied voltage V was variable, and the capacitance of the capacitor C was 200 pF. Using this circuit, a surge current was discharged through the semiconductor laser device. In the case of the semiconductor laser device of this embodiment, the laser characteristics started to deteriorate when the supplied voltage was 130 V (hereinafter, this voltage is referred to as the breakdown voltage).

By contrast, in the case of the semiconductor laser device used for comparison, which differed from the semiconductor laser device of this embodiment in that the cap was formed out of Kovar, the laser characteristics started to deteriorate at as low a voltage as about 60 V. That is, the semiconductor laser device of this embodiment has a breakdown voltage about 70 V higher and thus better than that of the device for comparison. More specifically, the characteristics deteriorated in the following manner. Discharge was performed while the charge voltage was raised gradually in steps, and, at every step, the drive current needed to yield a light output of 30 mW was evaluated. Below the above-mentioned breakdown voltage, the drive current exhibited hardly any change from its initial level (for example, about 60 mA, including only a change of about 3 mA or less from the initial level). As soon as the breakdown voltage was reached, however, the drive current was observed to suddenly rise (for example, to 100 mA or more).

The cause of the deterioration was analyzed and found to be damage inflicted on the end surface (the end surface portion near the ridge stripe) through which laser light was emitted from the nitride semiconductor laser chip 103. The deterioration was found to be irreversible. As described above, in a nitride semiconductor laser device wherein an insulating submount 102 is provided on a stem 101 and one electrode is formed on the back face of a conductive substrate, by forming a cap 106 out of an insulating material, it is possible to increase the surge withstand level. In particular, in a nitride semiconductor laser device wherein both a p-electrode 210 and an n-electrode 200 are insulated from a stem 101, by forming a cap 106 out of an insulating material, it is possible to increase the surge withstand level.

As described above, in the semiconductor laser device of the invention, the cap 106 for enclosing the nitride semiconductor laser chip 103 and the wires 111, 112 is made nonconductive. This makes it possible to effectively reduce the deterioration of the nitride semiconductor laser chip 103 resulting from a surge or make the nitride semiconductor laser chip 103 resistant to higher-level surges. Precisely why this is possible is unknown. It is surmised, however, that, in the semiconductor laser device of the invention, the absence of electrical shielding of the laser chip and the wires 111, 112 as achieved with a conductive cap permits a surge current pulse, a phenomenon that takes place very fast, to discharge elsewhere than through the laser chip (in particular, the light-emitting region thereof).

In a case where, as described above, a current flows elsewhere than through the light-emitting region in the high-frequency region, it may be impossible to modulate the semiconductor laser chip at a high rate. The maximum modulation rate needed in the application of an optical recording system is about 300 MHz to 500 MHz, i.e., the frequency of the high-frequency superimposition used to reduce laser interference and thereby reduce the noise produced by returning laser light. Even at these rates, the semiconductor laser device of the invention can be modulated satisfactorily without any particular problem. That is, the semiconductor laser device of the invention can be used satisfactorily at least when it is modulated at 500 MHz or less.

Embodiment 2

Figure 4A:
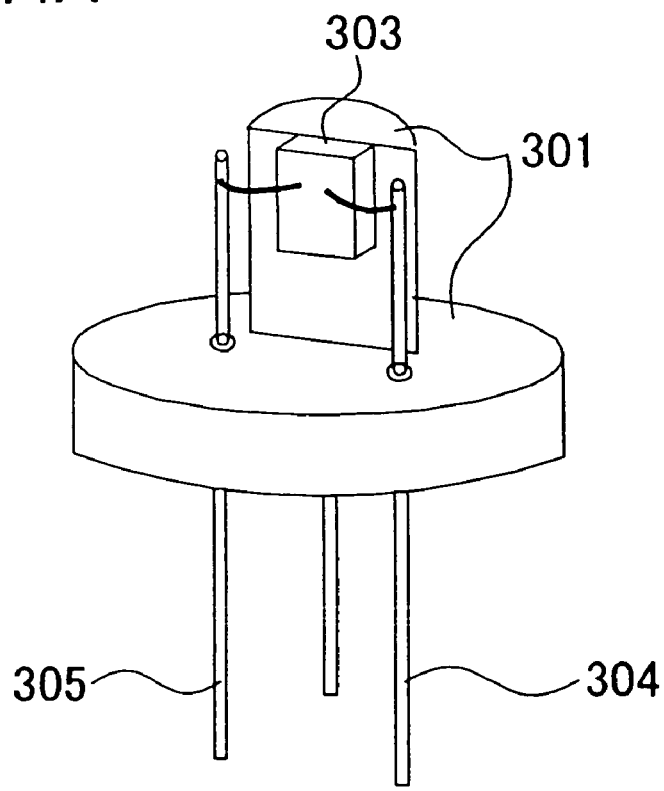
FIG. 4A is a perspective view of a semiconductor laser device of a second embodiment of the invention, with the cap thereof removed to show the structure inside.
Figure 4B:
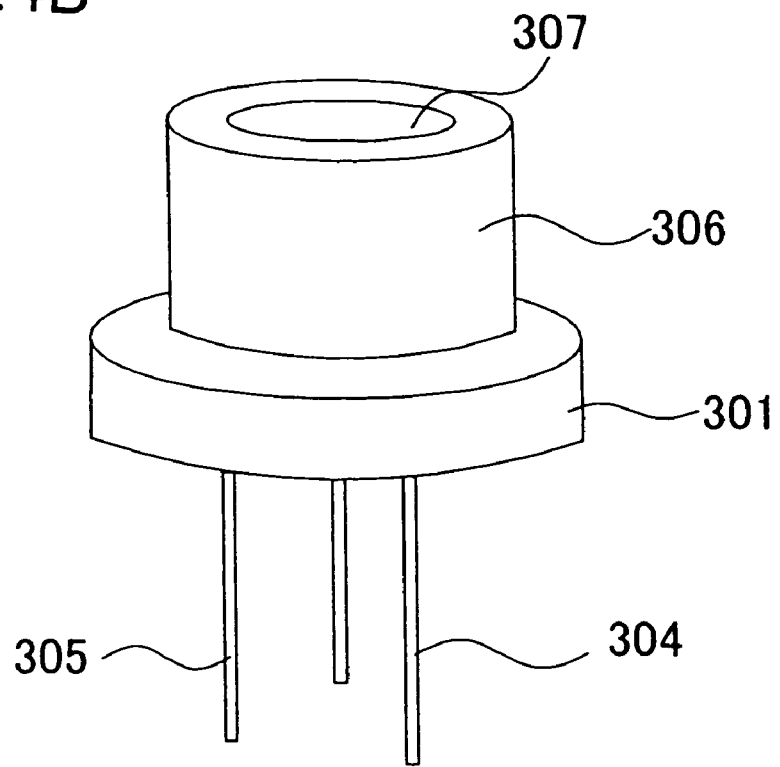
FIG. 4B is a perspective view showing the exterior appearance of the laser device of the second embodiment.

FIG. 4A is a perspective view of a semiconductor laser device of a second embodiment of the invention, with the cap thereof removed to show the structure inside, and FIG. 4B is a perspective view showing the exterior appearance of the laser device of the second embodiment. A nitride semiconductor laser chip 303 is mounted directly on a metal stem 301. The metal stem 301 has, on the top face of a disk-shaped plate, a semicircular-column-shaped projecting portion on which to mount the nitride semiconductor laser chip 303. The nitride semiconductor laser chip 303 is so mounted that the light outputted therefrom is emitted in the direction perpendicular to the disk-shaped plate of the stem 301. One electrode on the top face of the nitride semiconductor laser chip 303 is electrically connected, via a wire, to a pin 304 fixed to the stem 301. Another electrode on the top face of the nitride semiconductor laser chip 303 is connected, via a wire, to another pin 305. The nitride semiconductor laser chip 303 and the wires are protected by being enclosed in a nonconductive cap 306. The cap 306 has formed therein a window 307 through which to extract laser light.

Figure 5:
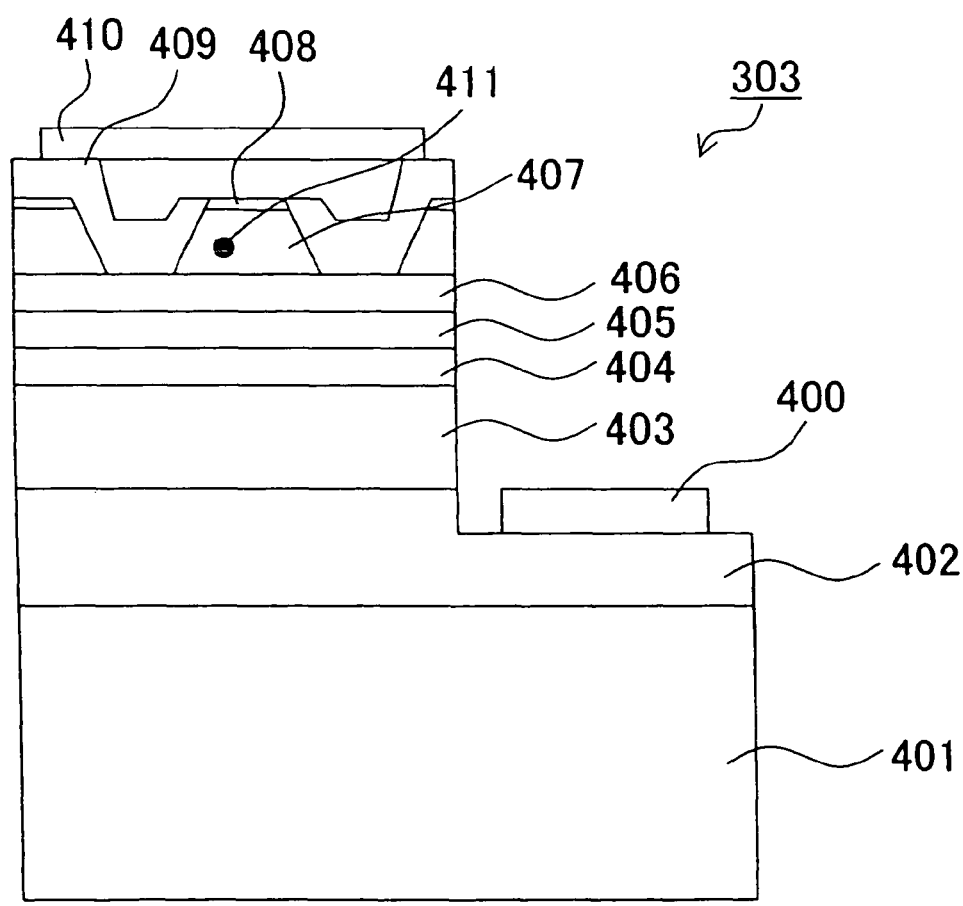
FIG. 5 is a side view of the nitride semiconductor laser chip used in the second embodiment.

FIG. 5 is a side view of the nitride semiconductor laser chip 303 used in the second embodiment. What FIG. 5 shows is the state of the nitride semiconductor laser chip 303 before it is mounted on the stem 301. The nitride semiconductor laser chip 303 has, on top of a high-resistance GaN substrate 401, the following layers laid on one another in the order in which they are named: an n-AlGaInN buffer layer 402, an n-AlGaInN clad layer 403, an n-AlGaInN guide layer 404, an AlGaInN multiple quantum well active layer 405, a p-AlGaInN guide layer 406, a p-AlGaInN clad layer 407, and a p-AlGaInN contact layer 408. The active layer may contain about 0.01% to 10% of a group V material such as As or P. In at least part of the p-AlGaInN guide layer 406, p-AlGaInN clad layer 407, and p-AlGaInN contact layer 408, a stripe-shaped ridge 411 is formed that extends in the direction of the cavity. A p-electrode 410 is formed in contact with the p-AlGaInN contact layer 408, and an insulating film 409 is formed beneath the p-electrode 410 except where the ridge is formed. Part of the n-AlGaInN buffer layer 402 is exposed toward the top face, and an n-electrode 400 is formed on that part.

As described above, the difference of the nitride semiconductor laser chip 303 from that of the first embodiment is that the substrate is insulating, with the result that the connection destination of the n-side wire is changed to the n-electrode 400 provided on the surface facing away from the substrate of the nitride semiconductor laser chip 303. The pins 304 and 305 are both electrically insulated from the metal stem 301. Moreover, the n-electrode 400 and the metal stem 301 are insulated from each other by the high-resistance GaN substrate 401. This permits voltages to be applied to the p- and n-electrodes 410 and 400 of the nitride semiconductor laser chip 303 arbitrarily relative to the stem 101. The metal stem 301 and the nonconductive cap 306 can be given the same structures as in the first embodiment. In this embodiment, the submount 102 used in the first embodiment is omitted; it is, however, possible to provided one, irrespective of whether it is conductive or insulating.

The semiconductor laser device of this embodiment, like that of the first embodiment, was subjected to electrostatic withstand voltage testing, and the breakdown voltage thereof was found to be about 130 V. By contrast, the semiconductor laser device used for comparison, which differed from the semiconductor laser device of this embodiment in that the cap 306 was formed out of Kovar, deteriorated at as low a voltage as about 80 V. That is, the semiconductor laser device of this embodiment has a breakdown voltage about 50 V higher and thus better than that of the device for comparison. The benefits of the present invention were thus proven also in this embodiment.

Third Embodiment

Figure 6:
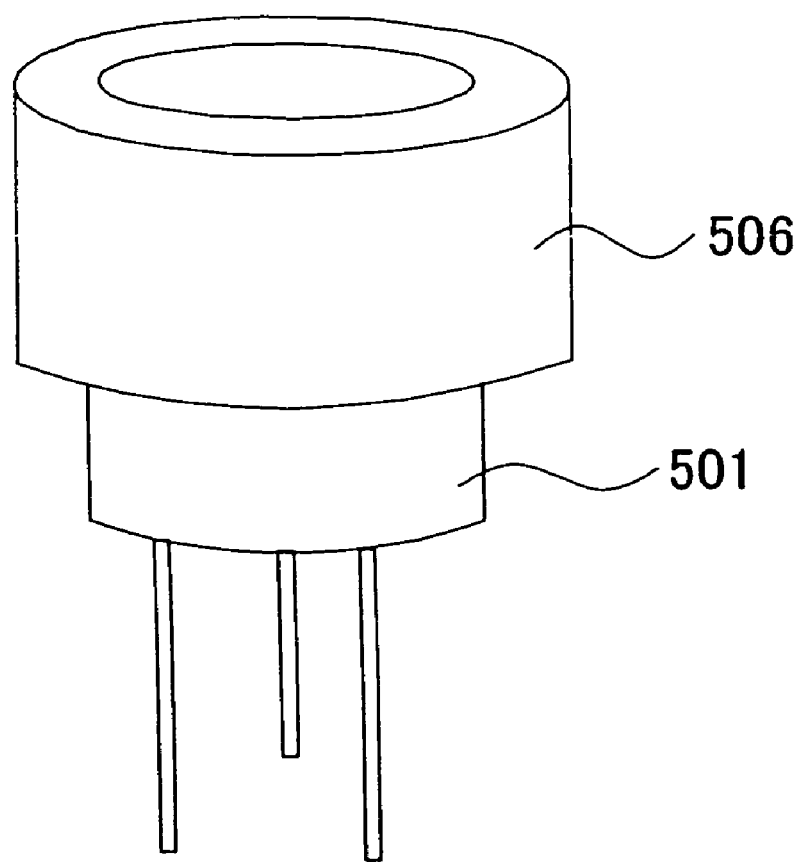
FIG. 6 is a perspective view showing the exterior appearance of the laser device of a third embodiment of the invention.
Figure 7A:
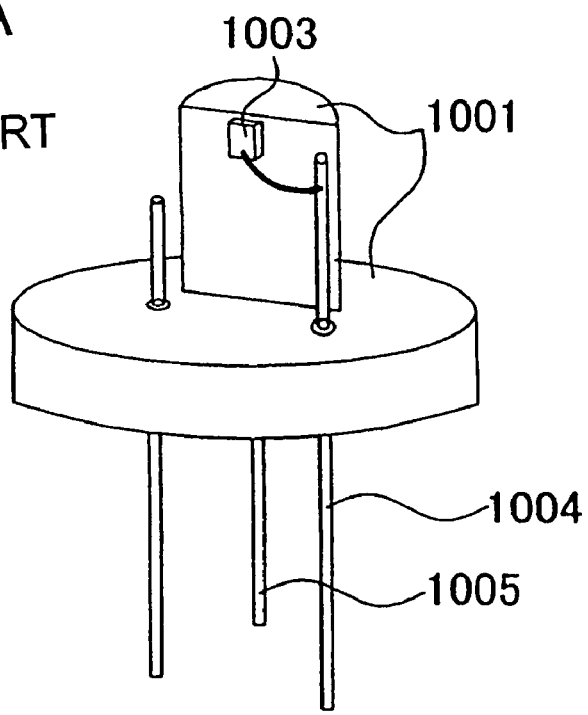
FIG. 7A is a perspective view of a conventional semiconductor laser device, with the cap thereof removed to show the structure inside.
Figure 7B:
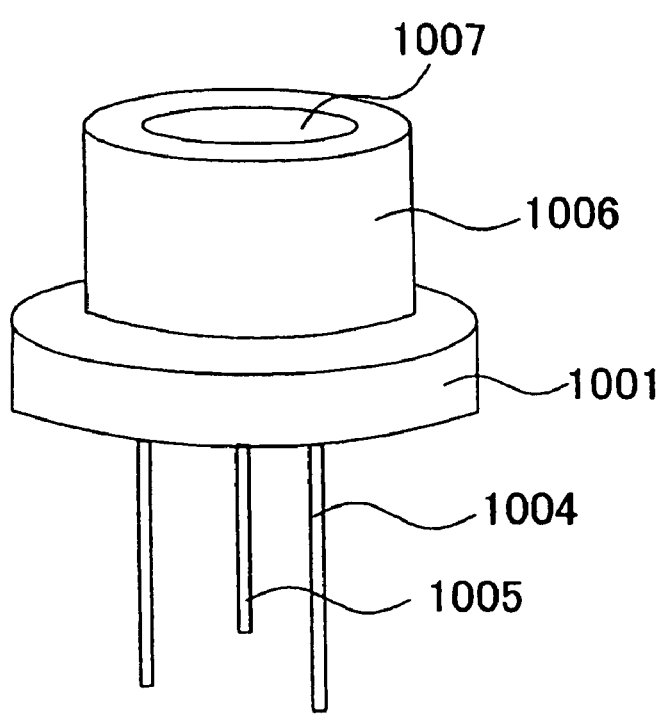
FIG. 7B is a perspective view showing the exterior appearance of the conventional laser device.

FIG. 6 is a perspective view showing the exterior appearance of the laser device of a third embodiment of the invention. Whereas in the first and second embodiments the nonconductive cap 101 or 103 is fixed on the top face of the disk-shaped portion of the stem, in the semiconductor laser device of this embodiment a cylindrical cap 506 and a stem 501 are fixed together in such a way that the side face of the disk-shaped portion of the stem 501 makes contact with the inner side face of the cap 506. In other respects, the structure here is the same as in the first or second embodiment. The semiconductor laser device of this embodiment exhibited a breakdown voltage approximately equal to that of the first or second embodiment, proving similar benefits of the present invention.

In the embodiments of the present invention described specifically above, many modifications and variations are possible within the scope and spirit of the present invention. For example, in the nitride semiconductor laser chip, the conductive substrate may be formed out of, instead of GaN, any other conductive material, such as AlGaN or SiC. The high-resistance substrate may be formed out of, instead of GaN, any other high-resistance (or insulating) material, such as AlGaN, SiC, or sapphire. The stem is described as being disk-shaped in the base portion thereof, but may have part thereof cut out so as to have D-shaped, with the side face shaved off at one side, or I-shaped, with the side face shaved off at opposite sides. This is effective in making the semiconductor laser device slim. The stem may be, rather than circular, rectangular. In the embodiments described above, the stem is described as being formed out of metal. This is in consideration of heat dissipation from the nitride semiconductor laser chip. In a case where no priority is given to heat dissipation, as in a case where the device is used in a low-output, non-high-temperature environment, the stem may be formed out of an inexpensive material such as resin. Even in this case, the present invention is expected to offer its benefits.

The present invention finds application in nitride semiconductor laser devices incorporating a nitride semiconductor laser chip, examples of such devices including independent-type semiconductor laser devices, hologram laser devices incorporating a hologram element, optoelectronic IC devices packaged integrally with an IC chip for driving or other processing such as signal detection, and composite optical devices packaged integrally with a waveguide or micro-optical element. The present invention finds application also in systems incorporating such devices, example of such systems including optical recording systems, optical disk systems, and light source systems operating in the ultraviolet to green region.

What is claimed is:

1. A nitride semiconductor laser device comprising:
a mount that is conductive;
a submount that is directly fixed to the mount and that is insulating;
a nitride semiconductor laser chip that is mounted on the submount;
a first electrical terminal that is fixed to the mount but that is insulated therefrom;
a wire that connects the first electrical terminal to a first electrode, which is a p-electrode, of the nitride semiconductor laser chip; and
a cap that encloses the wire, the nitride semiconductor laser chip, and the submount and that is fixed to the mount, wherein
the mount is formed out of gold-plated metal, and has a base portion that is plate-shaped and that is formed of metal predominantly containing iron and a column-shaped portion that projects from the base portion and that is formed of metal predominantly containing iron or metal predominantly containing copper, the insulating submount is directly mounted on a side face of the column-shaped portion,
the cap is formed out of a nonconductive material, and is fixed to the base portion,
between the nitride semiconductor laser chip and the insulating submount, a conductive member is provided, to which a second electrode, which is an n-electrode, provided on a bottom face of a substrate of the nitride semiconductor laser chip is electrically connected, the substrate being formed out of a nitride semiconductor,
a second electrical terminal is provided that is fixed to the mount but that is insulated therefrom, the second electrical terminal being connected, via a wire, to the conductive member, and
the second electrode of the nitride semiconductor laser chip is insulated from the mount.

2. The nitride semiconductor laser device of claim 1, wherein the submount is formed out of aluminum nitride or silicon carbide.

3. The nitride semiconductor laser device of claim 1, wherein the cap is formed out of engineering plastic or ceramic.

* * * * *